United States Patent
Sato et al.

(10) Patent No.: US 9,792,854 B2
(45) Date of Patent: Oct. 17, 2017

(54) DISPLAY DEVICE

(71) Applicant: Japan Display Inc., Tokyo (JP)

(72) Inventors: Toshihiro Sato, Tokyo (JP); Yuichi Numata, Tokyo (JP)

(73) Assignee: Japan Display Inc., Tokyo (JP)

( * ) Notice: Subject to any disclaimer, the term of this patent is extended or adjusted under 35 U.S.C. 154(b) by 140 days.

(21) Appl. No.: 14/645,600

(22) Filed: Mar. 12, 2015

(65) Prior Publication Data
US 2015/0262530 A1 Sep. 17, 2015

(30) Foreign Application Priority Data
Mar. 13, 2014 (JP) ................................. 2014-050809

(51) Int. Cl.
G09G 5/00 (2006.01)
G09G 3/3233 (2016.01)

(52) U.S. Cl.
CPC ... G09G 3/3233 (2013.01); G09G 2300/0426 (2013.01); G09G 2300/0452 (2013.01); G09G 2300/0852 (2013.01); G09G 2310/0205 (2013.01)

(58) Field of Classification Search
CPC ......... G09G 3/3233; G09G 2300/0426; G09G 2300/0452; G09G 2300/0852; G09G 2310/0205
USPC ........................................................ 345/83
See application file for complete search history.

(56) References Cited

U.S. PATENT DOCUMENTS

| | | | | |
|---|---|---|---|---|
| 5,485,293 A * | 1/1996 | Robinder | .............. | G02F 1/1368 345/88 |
| 5,648,792 A | 7/1997 | Sato et al. | | |
| 6,081,250 A * | 6/2000 | Shimada | .............. | G02F 1/1368 345/208 |
| 6,552,706 B1 * | 4/2003 | Ikeda | .................... | G09G 3/3607 345/100 |
| 6,809,719 B2 * | 10/2004 | Wu | ...................... | G09G 3/3648 345/100 |

(Continued)

FOREIGN PATENT DOCUMENTS

JP 3438190 B2 6/2003
JP 2008-181159 A 8/2008

(Continued)

OTHER PUBLICATIONS

Japanese Office Action dated Jun. 6, 2017 for corresponding JP Patent Application No. 2014-050809, with partial translation.

*Primary Examiner* — Benyam Ketema
(74) *Attorney, Agent, or Firm* — Typha IP LLC

(57) ABSTRACT

A display device includes a display area that includes sub-pixels arranged in a matrix having rows and columns, pixels formed of the combination of two sub-pixels, from which light of different wavelength regions is emitted, image signal lines arranged by two columns, scanning signal lines arranged by one in each row, pixel transistors disposed in the respective sub-pixels in which one image signal line is connected to a source of each pixel transistor, and the one scanning signal line is connected to a gate of the pixel transistor, light emitting elements that each emit light on the basis of a potential of a drain of the pixel transistor, and a drive circuit that applies a conduction potential for rendering the pixel transistors conductive to two scanning signal lines corresponding to two adjacent rows at the same time.

5 Claims, 10 Drawing Sheets

(56) References Cited

U.S. PATENT DOCUMENTS

| | | | |
|---|---|---|---|
| 7,283,142 B2* | 10/2007 | Credelle | G09G 3/2003 345/589 |
| 8,698,851 B2* | 4/2014 | Moon | G09G 3/3614 345/690 |
| 8,803,924 B2* | 8/2014 | Akimoto | G09G 3/3233 345/690 |
| 9,356,077 B2* | 5/2016 | Sato | G02F 1/1323 |
| 2008/0068524 A1* | 3/2008 | Kim | G02F 1/136286 349/38 |
| 2009/0102749 A1* | 4/2009 | Kawabe | G09G 3/3258 345/45 |
| 2009/0225009 A1* | 9/2009 | Ka | G09G 3/3233 345/76 |
| 2011/0241526 A1* | 10/2011 | Huang | G09G 3/3648 313/307 |
| 2012/0001885 A1* | 1/2012 | Kang | H01L 27/329 345/211 |

FOREIGN PATENT DOCUMENTS

| | | |
|---|---|---|
| JP | 2010-032838 A | 2/2010 |
| JP | 2013-250505 A | 12/2013 |
| JP | 2014-029424 A | 2/2014 |

\* cited by examiner

DISPLAY DEVICE

CROSS-REFERENCE TO RELATED APPLICATION

The present application claims priority from Japanese application JP2014-050809 filed on Mar. 13, 2014, the content of which is hereby incorporated by reference into this application.

BACKGROUND OF THE INVENTION

1. Field of the Invention

The present invention relates to a display device.

2. Description of the Related Art

In recent years, display devices using a self-luminous body such as organic light emitting diodes (OLED: organic light emitting diode) have been put into practical use. As compared with a related art liquid crystal display device, the display device including the organic EL (electroluminescent) display device using such an OLED employs the self-luminous body, and therefore not only is excellent in visibility and response speed, but also does not require an auxiliary lighting device such as a backlight. Therefore, the display device using the OLED can be further thinned.

Japanese Patent No. 3438190 discloses a TFT display device that selects adjacent scanning lines at the same time, and writes signals to be written to respective pixels with polarities opposite to each other.

Also, in the display device such as the organic EL display device, as with the liquid crystal display device, high definition is desired, and low power consumption is required. In a scanning line driving circuit for driving the scanning lines of the organic EL display device, because the number of scanning lines increases more as the higher definition progresses, there is a need to increase a driving frequency, and power consumption increases. The increase in the power consumption is a factor for preventing further higher definition.

SUMMARY OF THE INVENTION

The present invention has been made in view of the above-mentioned circumstances, and therefore an object of the present invention is to provide a display device with reduced power consumption even when the higher definition progresses.

According to the present invention, there is provided a display device including: a display area that includes a plurality of sub-pixels arranged in a matrix having a plurality of rows and a plurality of columns; pixels that are formed of the combination of at least two of the sub-pixels, from which light of different wavelength regions is emitted; image signal lines that are arranged by two in each of the plurality of columns; scanning signal lines that are arranged by one in each of the plurality of rows; pixel transistors that are disposed in the respective sub-pixels in which one of the two image signal lines is connected to one of a source and a drain of each of the pixel transistors, and the one scanning signal line is connected to a gate of the pixel transistor; light emitting elements that each emit light on the basis of a potential of the other of the source and the drain of the pixel transistor; and a drive circuit that applies a conduction potential for rendering the pixel transistors conductive to two of the scanning signal lines corresponding to two adjacent rows of the plurality of rows at the same time.

Also, in the display device according to the present invention, each of the pixels includes four of the sub-pixels that are substantially rectangular, and the four sub-pixels are arrayed in a matrix of two rows and two columns so that two sides of each of the sub-pixels are adjacent to the two other sub-pixels.

Also, in the display device according to the present invention, the combination of the two adjacent rows to which the conduction potential is applied is different between a first timing at which the conduction potential is applied, and a second timing at which the conduction potential is applied subsequent to the first timing, and in this case, further, an image signal based on first data is supplied to the image signal lines at the first timing, and an image signal based on second data calculated according to the first data is supplied to the image signal lines at the second timing.

Also, the display device according to the present invention may further include drive transistors each having a gate connected to the other of the source and the drain of each of the pixel transistors, and a source and a drain one of which is connected to an anode of each of the light emitting elements, and a metal layer formed of a planar electrode which is connected to the other of the source and the drain of each of the drive transistors, and overlaps with the display area in a plan view.

DETAILED DESCRIPTION OF THE INVENTION

Figure 1:
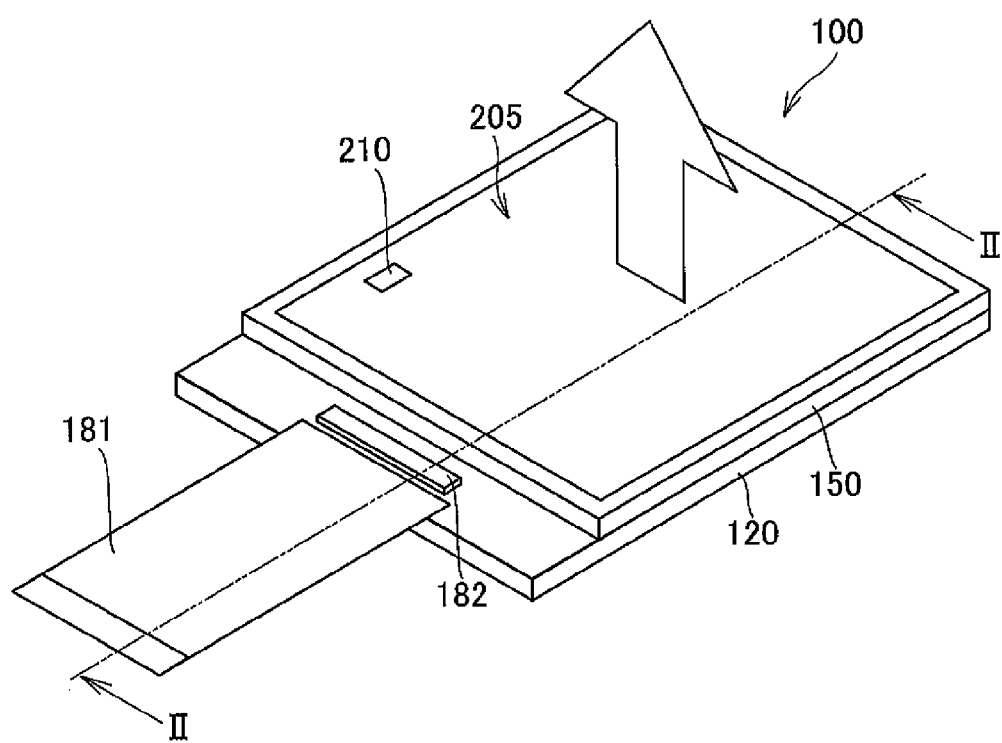
FIG. 1 is a diagram schematically illustrating an organic EL display device according to an embodiment of the present invention.

Hereinafter, the respective embodiments of the present invention will be described with reference to the accompanying drawings. The disclosure is merely exemplary, and appropriate changes that could be easily conceived by those skilled in the art without departing from the spirit of the present invention are naturally included within the scope of the present invention. Also, in the drawings, for more clarification of the illustration, as compared with actual embodiments, widths, thicknesses, and shapes of respective parts may be schematically illustrated, but may be merely exemplary, and do not limit the interpretation of the present invention. Also, in the present specification, and the respective drawings, the same elements as those described in the foregoing drawings are denoted by identical symbols, and their detailed description will be appropriately omitted.

FIG. 1 schematically illustrates an organic EL display device 100 which is a display device according to an embodiment of the present invention. As illustrated in FIG. 1, the organic EL display device 100 includes two substrates of a TFT (thin film transistor) substrate 120, and a counter substrate 150, and a filler 191 (refer to FIG. 2) made of transparent resin is sealed between those substrates 120 and 150. A display area 205 formed of pixels 210 arranged in a matrix is formed in the TFT substrate 120 and the counter substrate 150 of the organic EL display device 100. In this example, it is assumed that each of the pixels 210 is formed of plural sub-pixels 212 (to be described later), and in this embodiment, the sub-pixels 212 are arranged in x rows and y columns in the display area 205.

Also, the TFT substrate 120 is formed of a substrate made of an insulating material of transparent glass or resin, and a drive IC (integrated circuit) 182 is mounted on the TFT substrate 120. The drive IC 182 is a drive circuit that applies a potential for conducting between a source and a drain of a pixel transistor 220 (to be described later) arranged in each of the sub-pixels 212 to a scanning signal line Ln (n is a natural number of y or lower) connected to a gate of the pixel transistor 220, and also applies a voltage corresponding to a gradation value of each sub-pixel 212 to an image signal line Pm (m is a natural number of x or lower). The TFT substrate 120 is fitted with an FPC (flexible printed circuits) 181 for receiving an image signal from an external. Also, this embodiment employs a top emission organic EL display device in which light is emitted toward a side on which a light emitting layer of the TFT substrate 120 is formed as indicated by an arrow in FIG. 1, but may employ a bottom emission organic EL display device.

Figure 2:
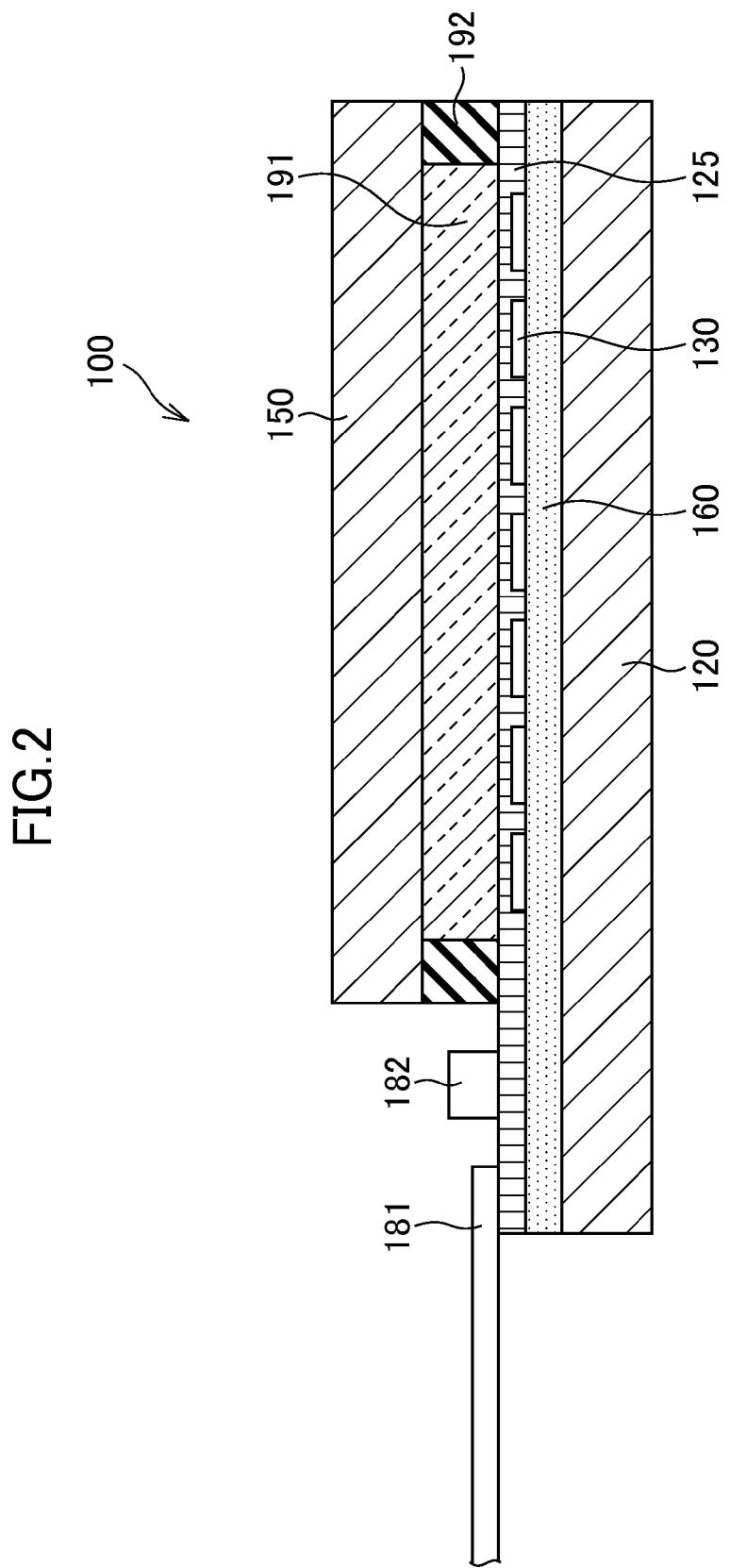
FIG. 2 is a schematic cross-sectional view taken along a line II-II in FIG. 1.

FIG. 2 is a schematic cross-sectional view taken along a line II-II in FIG. 1. As illustrated in the cross-sectional view, a TFT circuit layer 160 in which a TFT circuit is formed, plural organic EL elements 130 that are plural light emitting elements formed on the TFT circuit layer 160, and a sealing film 125 that blocks moisture over the organic EL element 130 are formed on the TFT substrate 120. The same number of organic EL elements 130 as the number of sub-pixels 212 included in each of the pixels 210 is formed. However, for clarity in illustration of FIG. 2, the organic EL elements 130 are simplified. Also, color filters that transmit light of the respective different wavelength regions of, for example, three or four colors, and a black matrix that is a light shielding film that blocks light emitted from boundaries of the respective sub-pixels 212 are formed on the counter substrate 150. The filler 191 between the TFT substrate 120 and the counter substrate 150 is sealed with a sealant 192.

Figure 3:
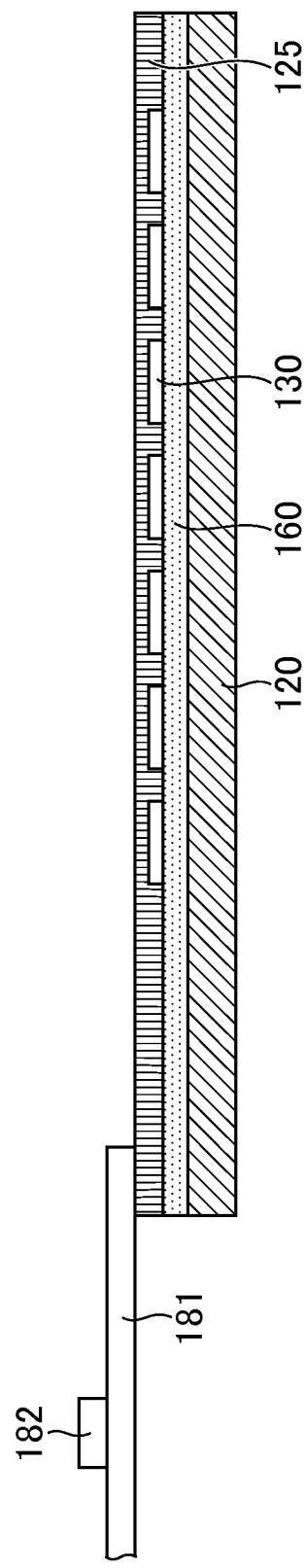
FIG. 3 is a diagram illustrating an example of an organic EL display device having no counter substrate.

This embodiment employs a configuration having the counter substrate 150 as illustrated in FIG. 2, but can employ a configuration having no counter substrate 150 as illustrated in FIG. 3. Also, as illustrated in FIG. 3, the drive IC 182 may be arranged on the FPC 181. In particular, when the TFT substrate 120 is made of a flexible resin material, the TFT substrate 120 may be configured integrally with the FPC 181. Also, in this embodiment, the organic EL elements 130 emit white light, and the color filters are used to transmit the light of the wavelength regions of three or four colors. Alternatively, the organic EL elements 130 may be configured to emit the light of the respective different wavelength regions of, for example, three or four colors.

Figure 4:
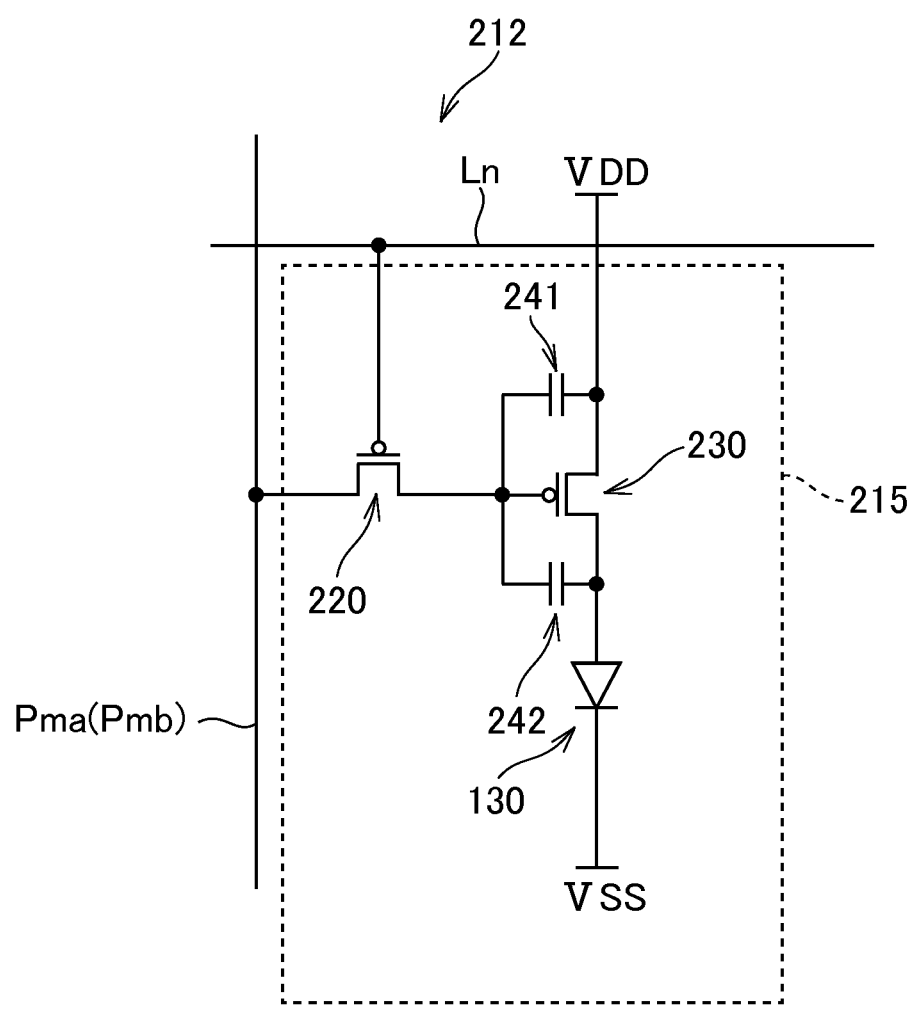
FIG. 4 is a circuit diagram illustrating an example of a circuit in each sub-pixel.

FIG. 4 is a circuit diagram illustrating an example of a circuit in each of the sub-pixels 212. The operation of the circuit for light emission will be described with reference to FIG. 4. An image signal corresponding to a gradation value of each of the sub-pixels 212 is supplied to the image signal line Pm, and the pixel transistor 220 is rendered conductive on the basis of the signal of the scanning signal line Ln, to thereby store a voltage based on the gradation value in at least one of capacitors 241 and 242. A drive transistor 230 allows a current based on a potential stored in at least one of the capacitors 241 and 242 to flow into the organic EL element 130 to emit light. A cathode side of the organic EL element 130 is connected to a low reference potential VSS, and a source side (a side opposite to the organic EL element 130 side) of the drive transistor 230 is connected to a high reference potential line held to a high reference potential VDD. In this example, it is assumed that a circuit surrounded by a dashed line except for the scanning signal line Ln and the image signal line Pm for the purpose of later description is a pixel circuit 215.

Figure 6:
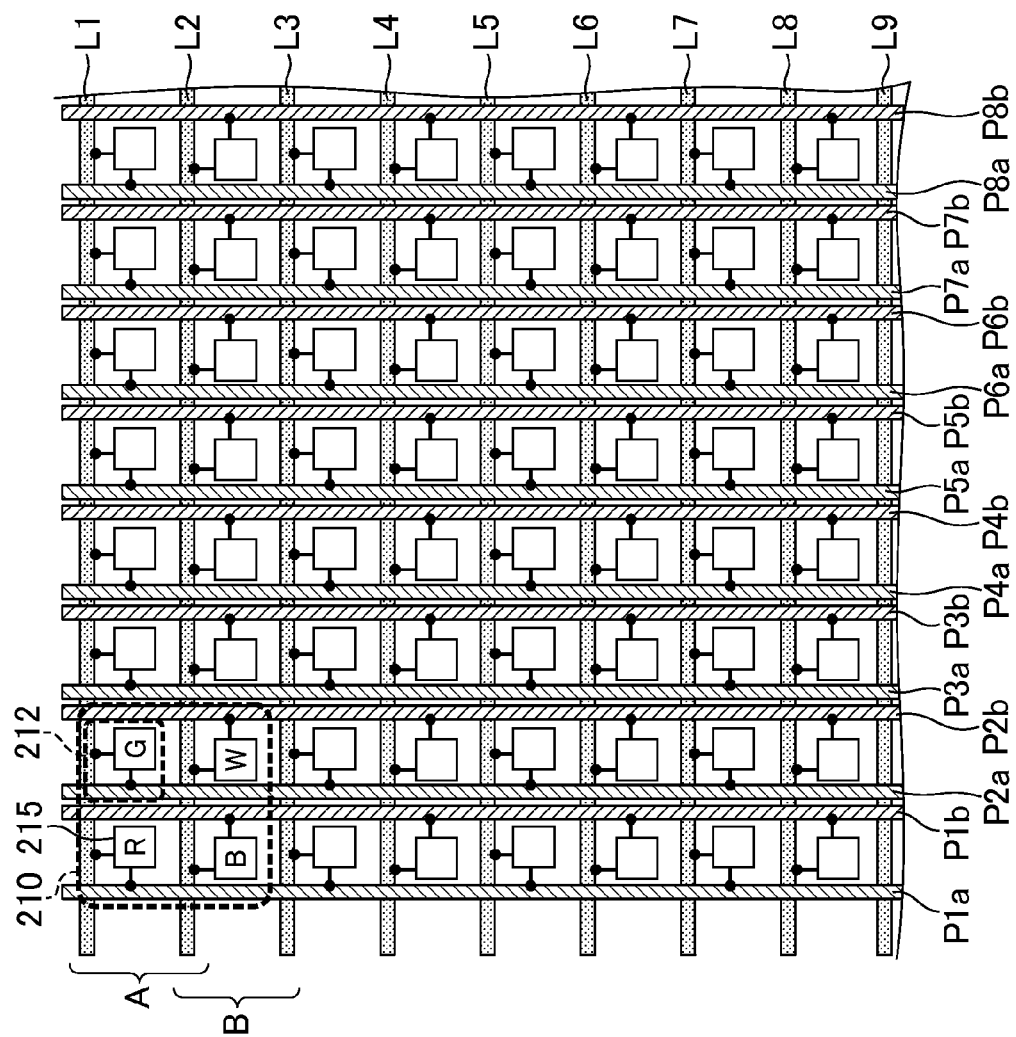
FIG. 6 is a diagram illustrating a modification of the arrangement of the sub-pixels as with FIG. 5.

Both of the respective capacitors 241 and 242 may be formed, or any one capacitor may be formed. In this circuit diagram, a p-type semiconductor is used, but an n-type semiconductor may be used. Also, the circuit in FIG. 6 is a simple circuit for describing the control of the light emission, and has two transistors. Alternatively, the circuit may be configured to have three or more transistors, or may include another control line or capacitor. The configuration of the circuit can be arbitrarily determined.

Figure 5:
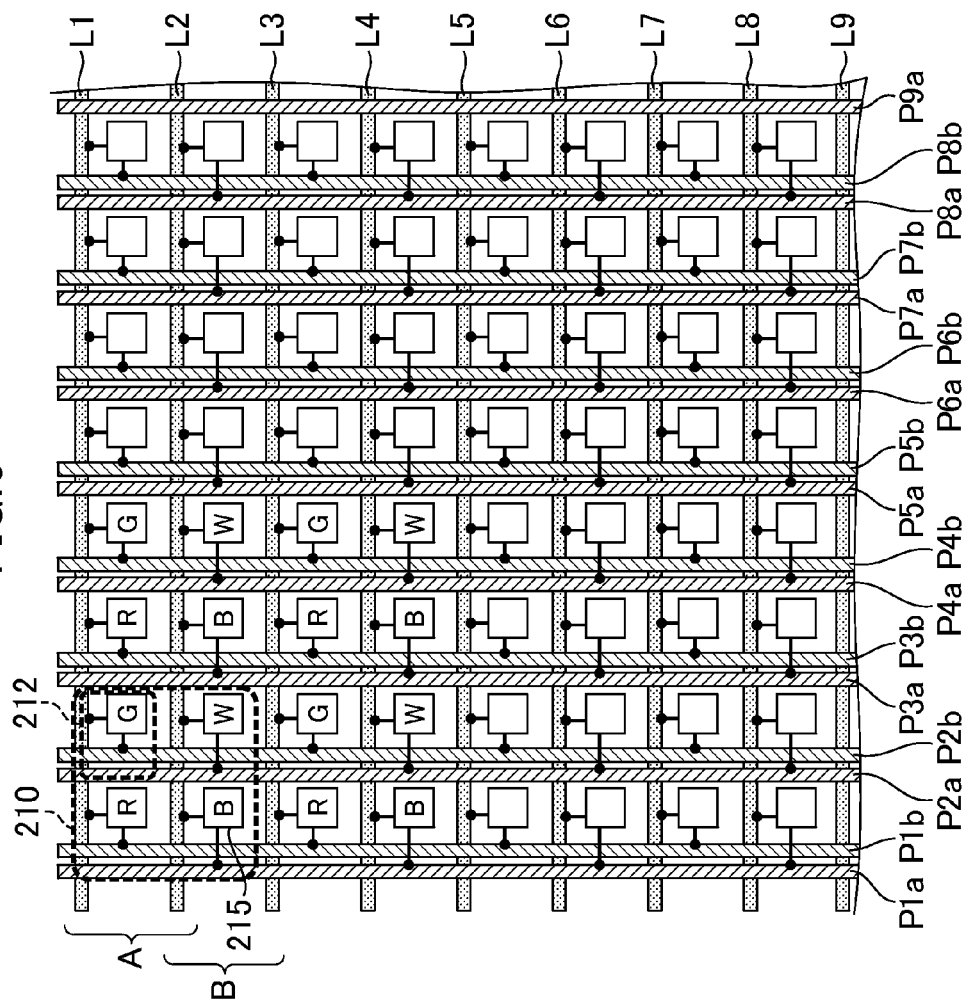
FIG. 5 is a diagram schematically illustrating a state of arrangement of image signal lines Pm and scanning signal lines Ln, which are input to the circuit of each sub-pixel in a part of the display area.

FIG. 5 is a diagram schematically illustrating a state of arrangement of the image signal lines Pm and the scanning signal lines Ln, which are input to the circuit of each of the sub-pixels 212 in a part of the display area 205. In FIG. 5, each of the pixels 210 is formed of four substantially rectangular sub-pixels 212 that emit the light of the wavelength regions corresponding to four kinds of colors of R(red), G(green), B(blue), and W(white). The four sub-pixels 212 are aligned in a matrix of two rows and two columns so as to come in contact with two sides of two other sub-pixels 212 in the same pixel 210. Therefore, each of the pixels 210 is configured by the sub-pixels 212 located in two adjacent rows.

One scanning signal line Ln is arranged for the row of each sub-pixel, and two image signal lines Pma and Pmb are arranged for the column of each sub-pixel 212. For example, image signal lines P1a and P1b are arranged in a first column of the sub-pixels 212. Also, the circuits of the sub-pixels 212 in odd rows, that is, the sub-pixels 212 connected to the scanning signal lines L1, L3 . . . are connected to the image signal lines Pmb (for example, P1b, P2b, . . . ) of the two image signal lines Pma and Pmb, and the circuits of sub-pixels 212 in even rows, that is, the sub-pixels 212 connected to the scanning signal lines L2, L4, . . . are connected to the image signal lines Pma (for example, P1a, P1b, . . . ).

Also, because the drive IC 182 which is the drive circuit can apply potentials different from each other to the image signal lines Pma and Pmb, the drive IC 182 can apply a conduction potential for conducting the transistor of each pixel circuit 215 to one of the scanning signal lines Ln in the odd rows, and one of the scanning signal lines Ln in the even rows at the same time, and can apply the different potentials corresponding to the gradation values of the respective sub-pixels 212 to the pixel circuit 215.

For example, when the drive IC 182 performs scanning so as to apply the conduction potential to the two scanning signal lines L1 and L2 in two adjacent rows at the same time, and apply the conduction potential to the scanning signal lines L3 and L4 in a next timing (timing of horizontal synchronization), the drive IC 182 can apply the corresponding gradation voltages to the respective sub-pixels 212 through the image signal lines Pma and Pmb, and can halve a frequency (horizontal synchronous frequency) for applying the conduction potential as compared with a case in which the scanning signal lines Ln are scanned one by one. For example, the above operation is conducted by the drive circuit of the scanning signal lines arranged within the drive IC 182 with the results that the power consumption of the drive circuit that scans the scanning signal lines can be suppressed, and the power consumption of the overall organic EL display device 100 can be reduced. Also, a scale of the drive circuit can be reduced, and a frame area can be reduced. On the other hand, even if the higher definition progresses, an increase in the frequency for scanning the scanning signal lines Ln associated with the higher definition can be suppressed, as a result of which an increase in the power consumption can be suppressed.

Also, another way to scan the scanning signal line in the arrangement of the image signal lines Pm and the scanning signal lines Ln in FIG. 5 will be described. When a period of the vertical synchronization is called "frame", in odd frames scanning is performed for each two rows, and scanning for applying the conduction potential to every two rows is performed in odd frames so that the conduction potential is first applied to the scanning signal lines L1 and L2 (A in FIG. 5) at the same time, and the conduction potential is then applied to the scanning signal lines L3 and L4 at the same time. That is, among the adjacent scanning signal lines, the scanning is performed for applying the conduction potential to the odd-numbered scanning signal line Ln, and the even-numbered scanning signal line Ln larger than the odd-numbered scanning signal line Ln by 1 at the same time. On the other hand, in even frames, scanning is performed so that after the conduction potential has been first applied to only the scanning signal line L1, the conduction potential is applied to the scanning signal lines L2 and L3 (B in FIG. 5), and the conduction potential is then applied to the scanning signal lines L4 and L5. That is, the scanning is performed for applying the conduction potential to the even-numbered scanning signal line Ln, and the odd-numbered scanning signal line Ln larger than the even-numbered scanning signal line Ln by 1, of the adjacent scanning signal lines Ln except for the first scanning signal line L1 (and a last scanning signal line Ly) at the same time.

That is, scanning can be performed so that the combination of the two adjacent scanning signal lines Ln (or the rows of the sub-pixels 212) to which the conduction potential is applied at the same time is different between a first timing that is timing of the odd frame when the conduction potential is applied to a certain scanning signal line Ln, and a second timing that is timing of the even frame which is a next timing when the conduction potential is applied to that scanning signal line. The combination of the scanning signal lines Ln and Ln+1 to which the conduction potential is applied at the same time is thus changed with the results that the occurrence of flicker of a display image or the like can be suppressed, and the display quality can be enhanced.

Further, the above scanning is performed, and for example, in the above-mentioned even frame, a complementary image formed by second data calculated on the basis of first data of images displayed in odd frames before and after the even frame can be displayed. In this case, the second data of the complementary image can be calculated in the drive IC 182, or an information processing unit for processing information for inputting information to the drive IC 182.

The second data of the complementary image in the pixels to which the conduction potential is applied at the same time in the even frame may be calculated on the basis of the data of the pixels around the previous frame, calculated on the basis of the data around the subsequent image, or calculated with the use of both of those data. In calculation of the complementary image, for example, a statistical process such as averaging can be simply used. Alternatively, so-called various super-resolution processing techniques that enable higher image quality to be expected can be also applied. In this way, particularly, the display of a moving picture and the like can be smoothed with the use of the complementary image. In this case, the odd-numbered frames are driven at a normal driving frequency to thereby display the complementary image that is different in the combination of the scanning signal lines Ln and Ln+1 in the even-numbered frames. As a result, the image finer and smoother than an actual resolution can be displayed. Also, even when the image higher in vertical resolution is originally entered, the high definition image can be easily displayed by the display device with a limited number of scanning lines.

The vertical scanning direction has been described above, but the same concept can be applied to the horizontal scanning to display the image with higher resolution. That is, in a first frame, one pixel is configured by data for four sub-pixels of RGBW in the combination of P1a and P1b with P2a and P2b for L1 and L2, but in a second frame, data for one pixel is configured by four sub-pixels of RGBW with the use of the combination of P2a and P2b with P3a and P3b.

As described above, since, for example, an ultra-high definition image that exceeds the number of pixels of the display can be easily displayed with the use of a combination technique for each of horizontal and vertical frames. Therefore, the display device can operate with the power consumption lower than that of the display device having the original number of pixels. This concept can be applied to all of the display devices including a liquid crystal display device without being limited to the organic EL element.

FIG. 6 is a diagram illustrating a modification of the arrangement of the sub-pixels 212 as with FIG. 5. FIG. 6 is different from FIG. 5 described above in that the image signal lines Pma and Pmb are arranged to sandwich the pixel circuit 215 therebetween. With this arrangement, because lines that extend from the respective pixel circuits 215 to the image signal lines Pma can be wired without crossing the image signal lines Pmb, an area for wiring can be reduced, and a capacity and an opening can be increased. Also, because a complex wiring is reduced, a manufacturing process is simplified, and the yield can be improved.

Figure 7:
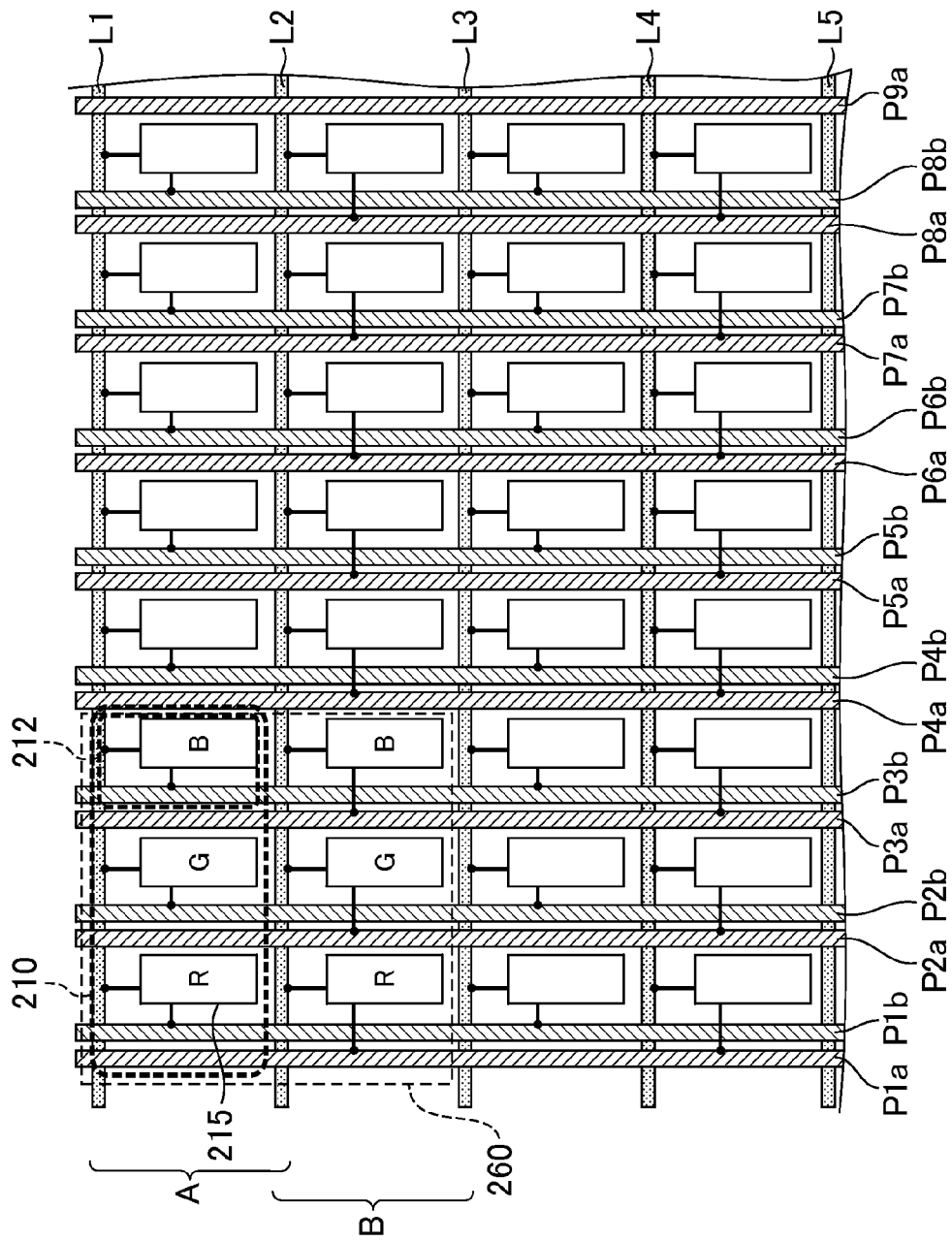
FIG. 7 is a diagram illustrating one case in which the arrangement of the sub-pixels in each pixel is different.

FIG. 7 is a diagram illustrating one case in which the arrangement of the sub-pixels 212 in each of the pixels 210 is different. In FIG. 7, each of the pixels 210 includes the substantially rectangular sub-pixels 212 that emit the light of the wavelength regions corresponding to three kinds of colors of R(red), G(green), and B(blue), and the sub-pixels 212 of a so-called stripe arrangement in which the sub-pixels 212 of the same color are aligned in the row (vertical) direction are configured. Also, pixels in a row A and pixels in a row B form a substantial square 260. In the case of this pixel arrangement, each of the pixels 210 is not configured to cross two rows of the sub-pixels 212, but each of the pixels 210 is configured to fall within one row. Even in this configuration, as with FIG. 5, the conduction potential is applied to the scanning signal lines Ln and Ln+1 at the same time, thereby being capable of obtaining the same effects. Also, as described above, the drive circuit performs the operation of changing the combination of the scanning signal lines Ln and Ln+1 to which the conduction potential is applied at the same time, thereby being capable of suppressing the occurrence of the flicker of the display image and the like, and enhancing the display quality. Also, the drive circuit performs the operation using the complementary image, thereby being capable of particularly smoothing the display of a moving image or the like, and further capable of obtaining the image display finer and smoother than the actual resolution.

In this example, three kinds of pixels of RGB are arranged in a horizontal direction, and the same color is arranged in a vertical direction. However, one pixel is configured by RGB of Ln and RGB of Ln+1, thereby being capable of performing driving for changing the combination of the odd-numbered frame with the even-numbered frame. In addition, the operation of changing the combination of RGB in the horizontal direction to RGB, GBR, and BRG in the stated order is combined, thereby being capable of displaying the image with higher definition.

Figure 8:
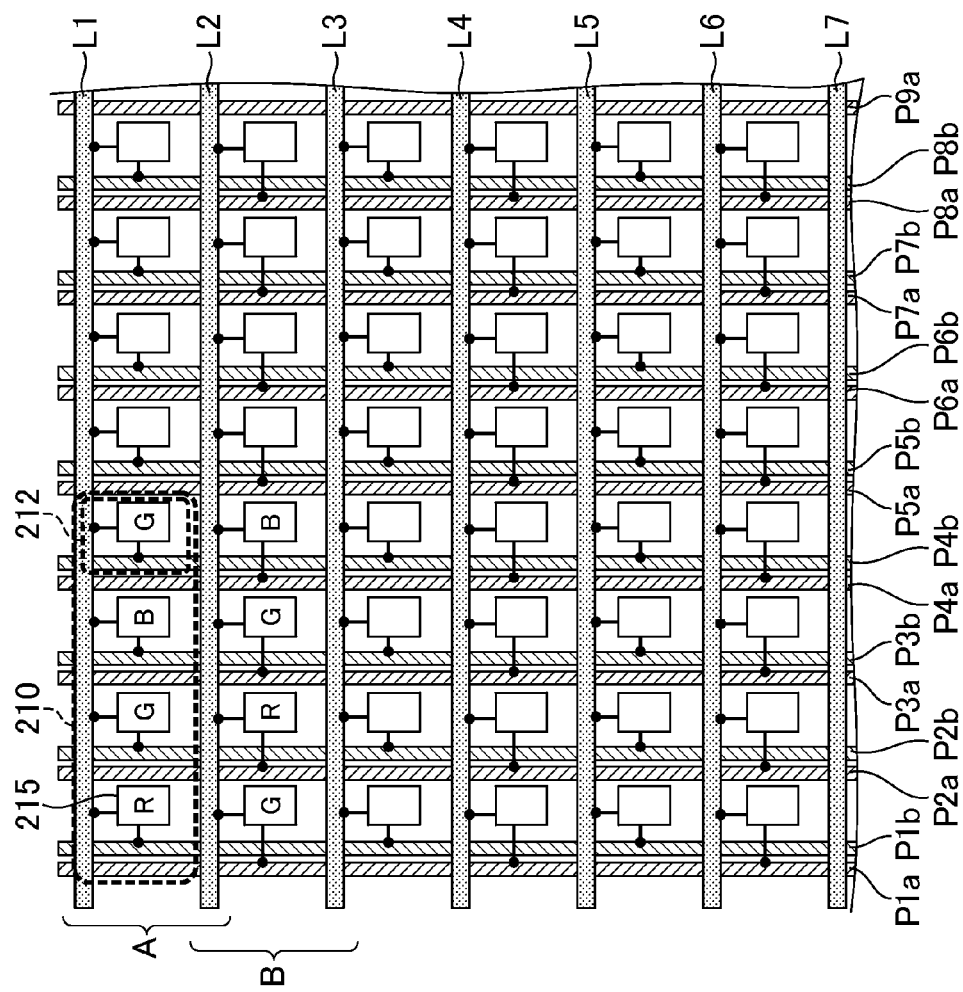
FIG. 8 is a diagram illustrating another case in which the arrangement of the sub-pixels in each pixel is different.

FIG. 8 is a diagram illustrating another case in which the arrangement of the sub-pixels 212 in each pixel 210 is different. In FIG. 8, as with FIG. 7, each of the pixels 210 includes the substantially rectangular sub-pixels 212 that emit the light of the wavelength regions corresponding to three kinds of colors of R(red), G(green), and B(blue). However, FIG. 8 is different from FIG. 7 in that each of the pixels 210 includes two sub-pixels 212 of G, and one pixel 210 is configured by four sub-pixels in total. Also, any one of RG and BG is repetitively aligned in a longitudinal direction. Even in this pixel configuration, the same operation as that in the case of the configuration of the sub-pixels 212 in FIG. 7 can be performed, and the same effects can be obtained.

Figure 9:
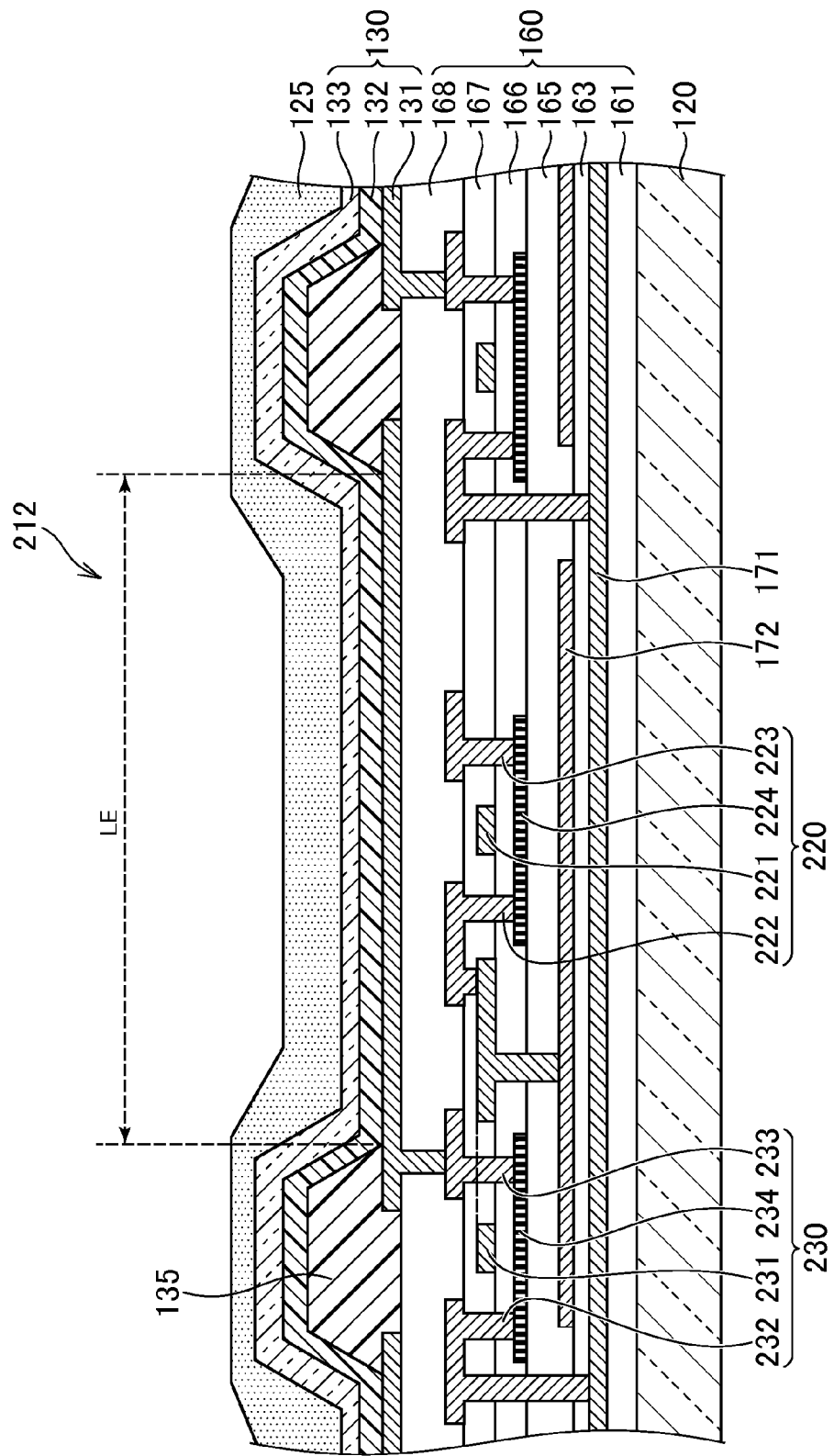
FIG. 9 is a cross-sectional view schematically illustrating each sub-pixel.

FIG. 9 is a cross-sectional view schematically illustrating each of the sub-pixels 212. In FIG. 9, the illustration of the filler 191 and the counter substrate 150 is omitted, and only the TFT substrate 120, the TFT circuit layer 160, the organic EL elements 130, and the sealing film 125 are illustrated. As illustrated in FIG. 9, the TFT circuit layer 160 includes the pixel transistor 220 and the drive transistor 230. Also, the TFT circuit layer 160 includes a first electrode 171 that is arranged between the TFT substrate 120, and the pixel transistor 220 as well as the drive transistor 230, overlaps with at least the plural sub-pixels 212 in a plan view, for example, overlaps with the overall display area 205. Also, a second electrode 172 made of a conductive material which forms a capacitor in cooperation with the first electrode 171 is arranged on a side of the first electrode 171 opposite to the TFT substrate 120 side, in this example, between the first electrode 171, and the pixel transistor 220 as well as the drive transistor 230, through insulating films 163 and 165.

In this example, the first electrode 171 is made of metal containing at least one of Mo (molybdenum) and W (tungsten), and can function as a solid electrode that covers the display area 205. With the use of refractory metal containing Mo or W, even if a heat treatment is performed during manufacture, there is no transformation caused by melting or the like, and the quality can be kept. In particular, it is effective that a semiconductor layer 224 or 234 is made of semiconductor such as polysilicon. The second electrode 172 can be made of refractory metal containing at least one of Mo and W, and the same effects can be obtained in this case. Also, with the use of a material having a high dielectric constant such as SiN for the insulating film 163, an electric capacitance formed by the first electrode 171 and the second electrode 172 can be more increased. In this example, each of the second electrodes 172 is formed for one sub-pixel 212, independently, and is connected to a circuit within the sub-pixel 212. In addition, a base film 161 made of an insulating material such as SiNx is formed.

The drive transistor 230 includes a gate 231, a source 232, and a drain 233, and the semiconductor layer 234 is arranged between the source 232 and the drain 233. Also, the pixel transistor 220 includes a gate 221, a source 223, and a drain 222, and the semiconductor layer 224 is arranged between the source 223 and the drain 222. The drain 222 of the pixel transistor 220 is connected to the gate of the drive transistor 230. An insulating film 166 made of an insulating material such as SiNx is formed between the semiconductor layers 224, 234, and the gates 221, 231, and an insulating film 167 made of an insulating material such as SiNx is formed on the gates 221 and 231. A planarizing film 168 made of an organic insulating material is formed on the pixel transistor 220 and the drive transistor 230.

Also, each of the organic EL elements 130 includes an anode electrode 131 connected to the drain 233 of the drive transistor 230 through a contact hole pierced in the planarizing film 168, a pixel separation film 135 made of an organic insulating material which covers an end of the anode electrode 131, and insulates the anode electrode 131 from another anode electrode 131 of the adjacent sub-pixel 212, an organic layer 132 that includes a light emitting layer formed to come in contact with the anode electrode 131 of each of the sub-pixels 212, and cover the display area 205, and a cathode electrode 133 that is a transparent conductive film made of complex oxide of indium and tin, or a complex oxide of indium and zinc. In this example, an area in which the anode electrode 131 comes in contact with the organic layer 132 functions as a light emitting area LE that emits light.

In the configuration described above, the first electrode 171 is connected to the source of the drive transistor 230, and also connected to the high reference potential VDD in plural locations outside of the display area 205 to hold a voltage of the high reference potential VDD. Also, the second electrode 172 is connected to the gate 231 (that is, the drain 222 of the pixel transistor 220) of the drive transistor 230. With the above configuration, the first electrode 171 and the second electrode 172 form the capacitor 241 in the circuit diagram of FIG. 6. Therefore, because the large capacitor 241 can be formed by the first electrode 171 and the second electrode 172, a current to be supplied to the organic EL elements 130 can be stabilized. Also, because the first electrode 171 and the second electrode 172 are formed on the TFT substrate 120 side of the drive transistor 230 and the pixel transistor 220, the capacitor can be formed without affecting the circuit configuration. Also, because the first electrode 171 is formed to be connected to the high reference potential VDD, and overlap with the display area 205, the first electrode 171 can provide the high reference potential VDD of a more uniform potential in the display area 205. Further, because the first electrode 171 does not require an additional line for supplying the high reference potential VDD in the circuit within each of the sub-pixels 212, the drive transistor 230 or the pixel transistor 220 can be formed with a larger size. That is, as indicated by the image signal lines Pma and Pmb in FIG. 5, even when two of the image signal lines Pm are arranged in each row of the sub-pixels 212, there is no need to provide an additional line for supplying the high reference potential VDD, and an area and an opening area used for the circuit can be widely kept. Also, with the configuration in which the first electrode 171 is connected to the plural locations outside of the display area 205, a further stable potential can be supplied. Also, because the first electrode 171 is formed to overlap with the display area 205, a heat generated in the organic EL elements 130 can be radiated with high efficiency, and electromagnetic noise generated in the circuit can be also blocked.

In the above-mentioned embodiments, the first electrode 171 is connected to the source of the drive transistor 230, and the second electrode 172 is connected to the gate 231 of the drive transistor 230. Alternatively, in the display area 205, the first electrode 171 is connected to the low reference potential VSS connected with the cathode side of the organic EL elements 130, and the second electrode 172 is connected to the drain 233 of the drive transistor 230, thereby being capable of forming a capacitor 243.

Figure 10:
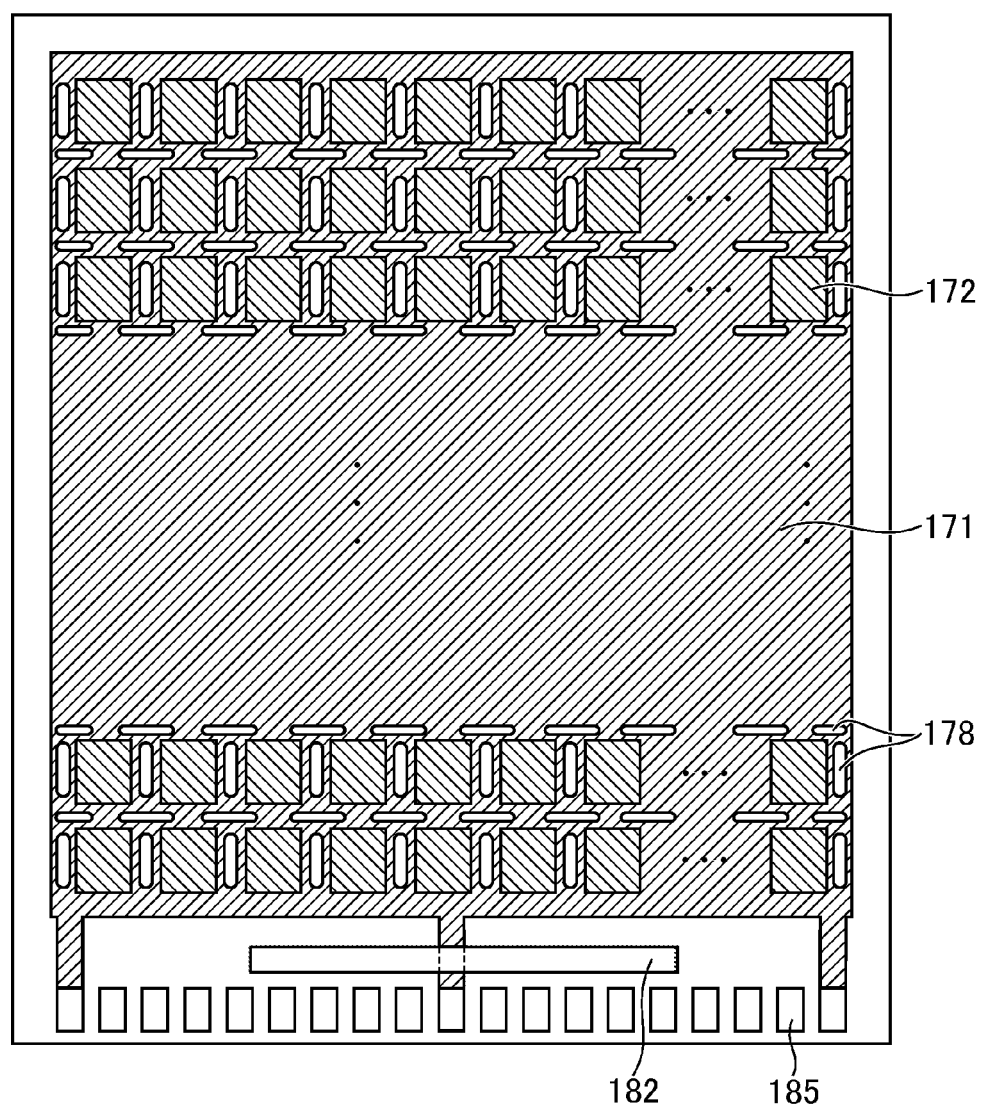
FIG. 10 is a plan view schematically illustrating arrangement of a first electrode and second electrodes.

FIG. 10 is a plan view schematically illustrating arrangement of the first electrode 171 and the second electrodes 172. As indicated in FIG. 10, the second electrodes 172 overlap with the first electrode 171 that extensively overlaps with the overall display area 205, and are arranged for each of the sub-pixels 212, independently. Also, the first electrode 171 is provided with slits 178 which are holes in plural locations. Because the first electrode 171 forms the capacitors in cooperation with the second electrodes 172, the slits 178 are provided in areas that do not overlap with the second electrodes 172. Also, outside of the display area 205, the first electrode 171 is electrically connected to plural terminals 185, and held to the high reference potential VDD.

The slits 178 can reduce a stress generated within the first electrode 171, and also can efficiently radiate heat. In FIG. 10, the slits 178 are shaped into holes, but the slits 178 may extend from one end to the other end so as to cut off the first electrode 171. In this case, the first electrode 171 is formed to overlap with at least a part of the drive transistor 230 and a part of the pixel transistor 220 in a plan view, and the first electrode 171 is connected to a fixed potential such as the high reference potential VDD.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising:
   a display area that includes a plurality of sub-pixels arranged in a matrix having a plurality of rows and a plurality of columns, at least two of the sub-pixels, from which light of different wavelength regions is emitted, constituting a pixel;
   two image signal lines corresponding to each of the plurality of columns;
   scanning signal lines corresponding one-to-one to the plurality of rows;
   a pixel transistor disposed in each of the sub-pixels, in which one of the two image signal lines is connected to a drain of the pixel transistor, and each of the scanning signal lines is connected to a gate of the pixel transistor;
   a light emitting element for emitting light in accordance with a potential of the drain of the pixel transistor; and
   a drive circuit for simultaneously applying a conduction potential to two of the scanning signal lines corresponding to two adjacent rows of the plurality of rows, the conduction potential rendering the pixel transistor conductive;
   a drive transistor having a gate connected to a source of the pixel transistor, a drain of the drive transistor is connected to an anode of the light emitting element; and
   a metal electrode layer connected to the a source of the drive transistor, the metal electrode layer entirely covering the display area in a plan view,
   wherein none of the sub-pixels is connected to both of the two scanning signal lines that correspond to the two adjacent rows of the plurality of rows.

2. The display device according to claim 1, wherein the pixel includes some of the sub-pixels in two rows of the plurality of rows of the sub-pixels.

3. The display device according to claim 2, wherein the pixel includes four of the sub-pixels, which that are substantially rectangular, and the four of the sub-pixels are arrayed in a matrix of two rows and two columns so that two sides of each of the four of the sub-pixels are adjacent to the other two of the sub-pixels.

4. The display device according to claim 1, wherein the conduction potential is applied to the two of the scanning lines sequentially at a first point of time and a second point of time, where a combination of the two adjacent rows of the plurality of rows at the first point of time and the second point of time is different from each other.

5. The display device according to claim 4, wherein an image signal based on first data is supplied to the two image signal lines at the first point of time, and another image signal based on second data calculated according to the first data is supplied to the two image signal lines at the second point of time.

\* \* \* \* \*